United States Patent [19]

Tsuchida et al.

[11] Patent Number: 4,649,521
[45] Date of Patent: Mar. 10, 1987

[54] PROGRAMMABLE READ-ONLY MEMORY (PROM) DEVICE HAVING REDUCED PROGRAMMING VOLTAGE CAPABILITY

[75] Inventors: Manabu Tsuchida, Yokohama; Masanobu Yoshida, Kawaguchi, both of Japan

[73] Assignee: Fujitsu Limited, Kawasaki, Japan

[21] Appl. No.: 674,813

[22] Filed: Nov. 26, 1984

[30] Foreign Application Priority Data

Nov. 24, 1983 [JP] Japan ................................. 58-219329

[51] Int. Cl.$^4$ .......................... G11C 7/00; G11C 11/40
[52] U.S. Cl. ...................................... 365/185; 365/194; 365/230
[58] Field of Search ............... 365/185, 184, 194, 230, 365/104, 233, 239; 357/23.5; 307/449, 463

[56] References Cited

U.S. PATENT DOCUMENTS

| | | | |
|---|---|---|---|
| 3,886,532 | 5/1975 | Wegener et al. | 365/230 |
| 4,340,943 | 7/1982 | Asano et al. | 365/194 |
| 4,374,430 | 2/1983 | Higuchi | 365/104 |
| 4,392,212 | 7/1983 | Miyasaka et al. | 365/230 |
| 4,531,202 | 7/1985 | Watanabe et al. | 365/104 |

OTHER PUBLICATIONS

Stewart et al., "A Yons CMOS E$^2$PROM", IEEE ISSCC Dig. of Tech. Papers, 2-11-82, pp. 110-111, 303.

Primary Examiner—James W. Moffitt
Assistant Examiner—Glenn A. Gossage
Attorney, Agent, or Firm—Armstrong, Nikaido, Marmelstein & Kubovcik

[57] ABSTRACT

A programmable read-only memory device comprising a memory cell transistor which has a floating gate and a control gate formed above the floating gate. The programmable read-only memory device further comprises a means for delaying the application timing of a high voltage to the control gate from that of a high voltage to the drain of the memory cell transistor when a data programming operation is performed by applying the high voltage to the control gate and the drain of the memory cell transistor, thereby ensuring reliable a data write operation even at a low programming voltage.

11 Claims, 13 Drawing Figures

4,649,521

PROGRAMMABLE READ-ONLY MEMORY (PROM) DEVICE HAVING REDUCED PROGRAMMING VOLTAGE CAPABILITY

BACKGROUND OF THE INVENTION

1. Field of the Invention

The present invention relates to a semiconductor memory device and, more particularly, to a programmable read-only memory device wherein each memory cell comprises a transistor (referred to as a floating gate transistor hereinafter) having a floating gate and a control gate formed above the floating gate, and data can be programmed into the floating gate transistor reliably even at a low programming voltage.

2. Description of the Prior Art

Recently, the programming voltage for an EPROM (erasable programmable read-only memory) having a floating gate transistor as a memory cell has been lowered. This is mainly because transistors in a peripheral circuit are micropatterned and have a low breakdown voltage to realize a high density memory device, and the programming voltage must be lowered in accordance with such a reduced breakdown voltage. However, when the programming voltage is lowered, a programming current is also reduced to realize a high memory density memory device. As a result, data may not be properly programmed into a memory cell. For this reason, the peripheral circuit or the like must be improved to ensure that data is properly programmed into the corresponding memory cell.

In a conventional memory device, data is programmed into a memory cell, i.e., a floating gate transistor, by applying high voltages to the control gate and the drain of the transistor. However, since the application timings of the high voltages are not particularly determined, the programming operation of the floating gate transistor is not properly performed, especially when the high voltage is applied to the drain after it is applied to the control gate, or after the control gate voltage becomes relatively high.

SUMMARY OF THE INVENTION

The object of the present invention is to resolve the above problem, by providing a semiconductor memory device wherein each cell is constituted by a floating gate transistor, a drain voltage at the floating gate transistor increases faster than a gate voltage so as to properly program data into a memory cell even if a low programming voltage is used or a small programming current flow, and the transistors in the peripheral circuit or the like are micropatterned to realize a high density memory device.

According to the present invention, there is provided a programmable read-only memory device comprising: a memory cell transistor having a source, a drain, a floating gate, and a control gate formed above the floating gate; and a delay means for delaying the application timing of a high voltage applied to the control gate from that of a high voltage applied to the drain of the memory cell transistor when a data programming operation is performed by applying the high voltages to the control gate and the drain of the memory cell transistor.

BRIEF DESCRIPTION OF THE DRAWINGS

FIG. 3A depicts a conventional example, and FIG. 3B depicts operation in accordance with the present invention;

DESCRIPTION OF THE PREFERRED EMBODIMENTS

Before describing the preferred embodiments, an explanation will be made of the programming operation of a floating-gate transistor used as a memory cell of an EPROM device.

Figure 1:
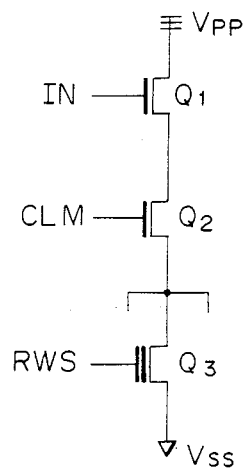
FIG. 1 is a partial circuit diagram illustrating an equivalent circuit in a programming mode of a general EPROM device.

FIG. 1 shows an equivalent circuit diagram of a conventional EPROM in the programing mode. Referring to FIG. 1, reference symbol $Q_1$ denotes a data programming transistor; $Q_2$, a column selection transistor; and $Q_3$, a memory cell transistor having a floating gate (floating gate transistor). These transistors are connected in series between a high voltage of $V_{PP}$, for example, 25 V, as a write voltage and a voltage $V_{SS}$ as the ground voltage. A program signal IN is applied to the gate of the transistor $Q_1$. The program signal IN is set at the high voltage $V_{PP}$ when programming data of logic "0" is supplied. However, the program signal IN is set at the ground voltage when programming data of logic "1" is supplied. A column selection signal CLM is applied to the gate of the transistor $Q_2$, and a row selection signal RWS is applied to the gate of the floating gate transistor $Q_3$. These signals CLM and RWS are set at the high voltage $V_{PP}$ when the corresponding column and row are selected in the programming mode. However, when the column and row are not selected in the programming mode, the signal CLM and RWS are set at a ground voltage $V_{SS}$ of 0 V. The signals CLM and RWS are set at a high level, i.e., $V_{CC}$ (e.g., 5 V), when the corresponding column and row are selected in the read mode. However, when the column and row are not selected in the read mode, these signals CLM and RWS are set at the ground voltage $V_{SS}$.

Figure 2:
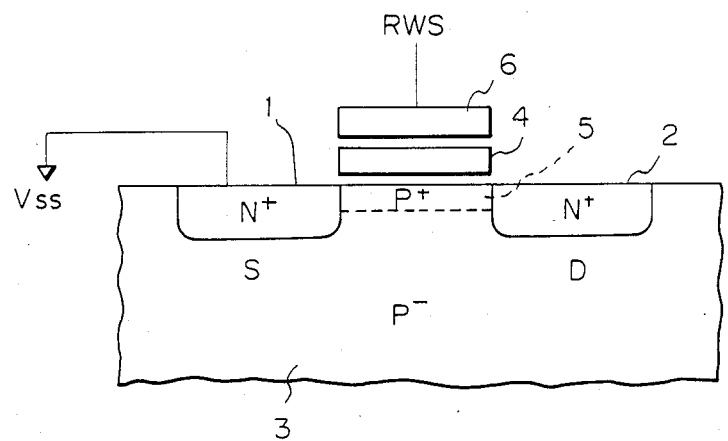
FIG. 2 is a cross section of a floating gate transistor used in the device of FIG. 1.

FIG. 2 illustrates a structure of the floating gate transistor $Q_3$ used in the circuit of FIG. 1. The floating gate transistor $Q_3$ comprises an $N^+$-type source region 1 and an $N^+$-type drain region 2 both formed on a $P^-$-type semiconductor substrate 3, a floating gate 4 made of, e.g., polycrystalline silicon, and formed on the $P^+$-type channel region 5 of the substrate 3 via an insulation layer (not shown), and a control gate 6 made of, e.g., polycrystalline silicon, and formed on the floating gate 4 via an insultation layer (not shown).

In order to program data into the floating gate transistor $Q_3$ in the circuit of FIG. 1, the column selection signal CLM and the row selection signal RWS are set at the high voltage $V_{PP}$, and the program signal IN is set at the high voltage $V_{PP}$ or the ground voltage $V_{SS}$ of 0 V accordance with the logical state of the programming of the data. In particular, when data of logic "0" is programmed, the program signal IN is set at the high voltage $V_{PP}$, and the transistors $Q_1$ and $Q_2$ are turned on. For this reason, the drain and gate of the floating gate transistor $Q_3$ receive the high voltage $V_{PP}$. Then, as is well known, electrons are injected into the floating gate of the floating gate transistor $Q_3$ by avalanche breakdown injection (including so-called channel injection), thereby programming data.

That is, in the structure of FIG. 2, when the high voltage is applied to the drain region 2, the drain side end of the channel region becomes pinched off due to the pinch-off effect and a depletion region extends between the end of the channel region and the drain. Therefore, the intensity of the electric field of the depletion region becomes very large and carriers in the depletion region are greatly accelerated by the electric field so that hot electrons are generated. In this case, if a high voltage is applied to the control gate 6, the hot electrons are attracted toward and injected into the floating gate 4 by the electric field generated by the high voltage of the control gate 6.

In the conventional EPROM, the application timings of the column selection signal CLM and the row selection signal RWS are not specifically controlled in the programming mode. In this case, no problem occurs when the programming voltage $V_{PP}$ is as high as, for example, 25 V, and the breakdown voltages of the transistors $Q_1$ and $Q_2$ are sufficiently high. However, when the size of the transistors $Q_1$ and $Q_2$ is decreased to realize a high density circuit, the programming current is restricted to a small value, so that a programming operation cannot be properly performed.

Figure 3A:
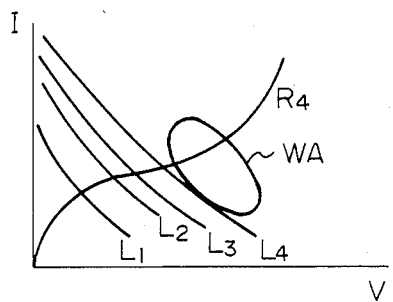
FIGS. 3A and 3B are graphs depicting the operating states of the circuit of FIG. 1 under different operating conditions.

As shown in FIG. 3A, when the row selection signal RWS increases prior to an increase in the column selection signal CLM and has reached the voltage $V_{PP}$, voltage-current characteristics between the drain-source path of the transistor $Q_3$ become as given by curve $R_4$ in FIG. 3A. In this state, when the column selection signal CLM increases, the characteristics of a load circuit of the transistors $Q_1$ and $Q_2$ are shifted upward from those of curves $L_1$, $L_2$ . . . and reach those of curve $L_4$ in FIG. 3A. Assuming that the curve $L_4$ is given as a load curve when the column selection signal CLM has reached $V_{PP}$, then the programming voltage cannot reach a programming region WA subjected to avalanche injection of the transistor $Q_3$ although the column selection signal CLM has reached the high voltage $V_{PP}$. Therefore, the programming operation cannot be performed. This is because the gate voltage at the transistor $Q_3$ goes to a high level faster than the drain voltage of the transistor. Thus, the current flowing through the transistor $Q_3$ becomes excessively large, and the programming currents of the transistors $Q_1$ and $Q_2$ are limited. As a result, the drain voltage will not be set at a high voltage (programming level), and the aforementioned hot electrons are not generated in the depletion region, so that the so-called avalanche injection or channel injection will not occur. Moreover, even when the row selection signal RWS and the column selection signal CLM simultaneously increase, the programming operation cannot be properly performed for the same reason as described above, if the programming current is not sufficiently large.

Figure 3B:
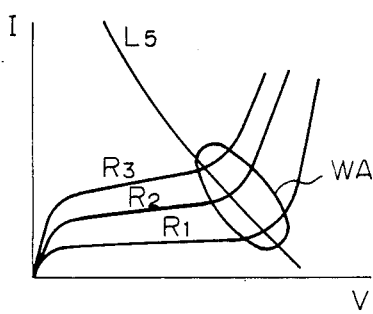

According to the present invention, in order to eliminate the problem with the conventional memory device, a column selection signal goes to a high level prior to the rising of a row selection signal, thereby effectively programming data. As shown in FIG. 3B, the column selection signal is increased to $V_{PP}$ and is set in a state indicated by a load curve $L_5$. In this state, the row selection signal RWS goes to a high level to shift the voltage-current characteristics of the transistor $Q_3$ upward in the order indicated by curves $R_1$, $R_2$, and $R_3$. At the leading edge of the row selection signal RWS, even if a conductance of the transistor $Q_2$ is small, a sufficiently high voltage (approximately $V_{PP}$) is applied to the drain of the memory cell transistor $Q_3$. Immediately after the transistor $Q_3$ is turned on, a parasitic capacitor attributed to the drain of the transistor $Q_3$ and charged with a sufficiently high voltage is discharged through the transistor $Q_3$, and thus a larger load of curve $L_5$ than the steady load of curve $L_4$ determined by an ON resistance of the transistor $Q_2$ is present during a transition period due to the parasitic capacitor. Therefore, during the transition period, the operating point of the transistor $Q_3$ can reach inside a programming region (subjected to avalanche injection or channel injection) WA.

When electrons are gradually stored in the floating gate by avalanche injection after the programming operation is started, an electrical field acting from the control gate to the channel region of the memory cell transistor $Q_3$ decreases, thereby decreasing the conductance. Therefore, even if the ON resistance of the column selection transistor $Q_2$ is sufficiently high, the self-conductance of the memory cell transistor $Q_3$ is gradually decreased, so that a high voltage substantially the same as the voltage $V_{PP}$ is gradually applied to the drain of the memory cell transistor $Q_3$, and the operating point falls within the programming region, thereby performing complete programming. To promote this effect, the row selection signal RWS should have a longer rise time in order to prolong the period of the high-efficiency avalanche injection which occurs immediately after the programming operation is started. Thus, even if a low programming voltage or small programming current is used, the operating point can reach the programming region WA in accordance with the method described above.

Figure 4:
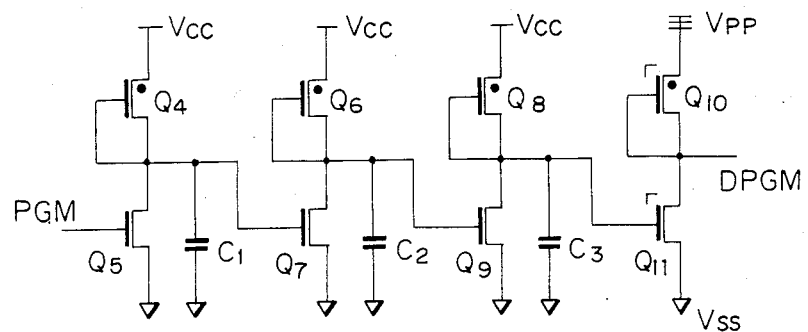
FIGS. 4, 5, and 6 are circuit diagrams showing various circuit portions of a memory device as an embodiment of the present invention.
Figure 5:
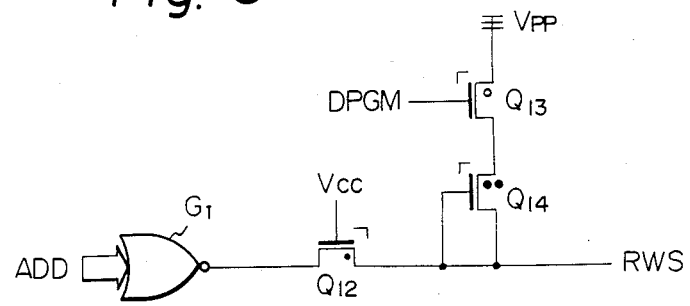
Figure 6:
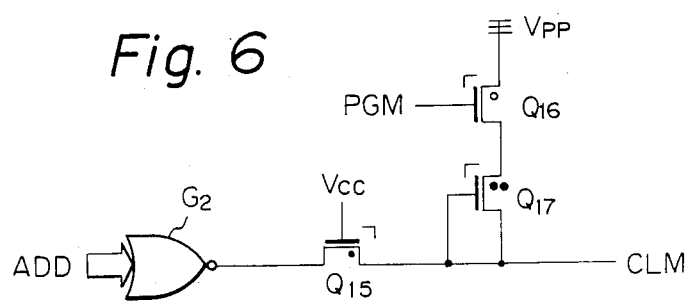

FIGS. 4, 5, and 6 show a semiconductor memory device using N-channel MIS transistors according to an embodiment of the present invention. FIG. 4 is a circuit diagram of a delay circuit for delaying a programming instruction signal, i.e., a program signal PGM. This delay circuit comprises inverter transistors $Q_4$, $Q_5$, . . . , and $Q_{11}$, and capacitors $C_1$, $C_2$, and $C_3$ connected to the output terminals of the respective inverters and power supply $V_{SS}$. It should be noted that the transistors $Q_4$, $Q_6$ and $Q_8$ are depletion type. The transistor $Q_{10}$ comprises a high-breakdown voltage depletion type transistor, and the transistor $Q_{11}$ is a high-breakdown voltage enhancement type transistor.

FIG. 5 shows a unit circuit of a row decoder provided to each row of the memory matrix (not shown). This unit decoder circuit comprises a NOR gate $G_1$ for receiving a unique combination of noninverted address signals (not shown) and inverted address signals ADD, a high-breakdown voltage depletion type transistor $Q_{12}$, a high-breakdown voltage deep-depletion (low threshold voltage) type transistor $Q_{14}$ and a high-breakdown voltage non-dosed (zero threshold voltage) type transistor $Q_{13}$. The transistor $Q_{14}$ comprises a transistor having a lower threshold voltage (e.g., $V_{th} = -5$ V) than the conventional depletion transistor (e.g., $V_{th} = -3$ V). The transistor $Q_{13}$ has a threshold voltage of 0 V. In the circuit shown in FIG. 5, an output from the gate $G_1$ goes to a high level when the associated row is to be selected. A row selection signal having the level $V_{CC}$ is applied to the gate of the corresponding memory cell transistor through the transistor $Q_{12}$. In this case, when a delayed program signal DPGM generated from the circuit of FIG. 4 goes to a level of the high voltage $V_{PP}$, the transistor $Q_{13}$ is turned on, and the high voltage $V_{PP}$ is generated as the row selection signal through the transistor $Q_{14}$. This high voltage signal is cut off by the transistor $Q_{12}$ from the gate $G_1$. The row selection signal RWS is set substantially at the $V_{CC}$ level in the read mode and is set at the $V_{PP}$ level in the programming mode. However, when the row is not selected, the output of 0 V from the gate $G_1$ appears as the row selection signal. The programming high voltage $V_{PP}$ is cut off by the transistor $Q_{14}$ and will not be applied to the gate $G_1$. During this operation, the power supply voltage $V_{CC}$ is set to be, for example, 5 V, and the programming high voltage $V_{PP}$ is set to be, for example, 12.5 V.

FIG. 6 shows the arrangement of a unit column decoder circuit. The unit column decoder circuit comprises a gate $G_2$ for receiving a unique combination of noninverted address signals (not shown) and inverted address signals ADD, a high-breakdown voltage depletion type transistor $Q_{15}$, a high-breakdown voltage nondosed type transistor $Q_{16}$, and a high-breakdown voltage deep depletion type transistor $Q_{17}$. The transistors $Q_{16}$ and $Q_{17}$ are the same as the transistors $Q_{13}$ and $Q_{14}$ of the decoder shown in FIG. 5, respectively. Unlike the decoder circuit in FIG. 5, the gate of the transistor $Q_{16}$ in the decoder circuit shown in FIG. 6 directly receives the program signal PGM. The operation of the decoder circuit in FIG. 6 is basically the same as that of FIG. 5, in that, when the associated column is to be selected, the output from the gate $G_2$ goes high, and the program signal PGM is set at the high voltage $V_{PP}$, thereby generating a column selection signal CLM which is set substantially at the high voltage $V_{PP}$.

Figure 7:
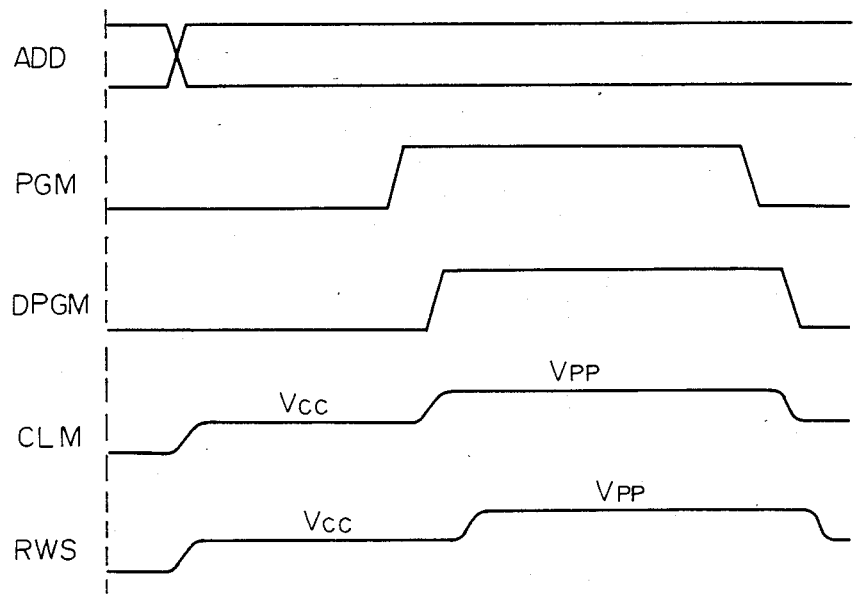
FIG. 7 is a waveform diagram illustrating the operation of the memory device including the circuit portions of FIGS. 4, 5, and 6.

In the above description, the program signal PGM is directly applied to the transistor $Q_{16}$ of the column decoder, and the program signal DPGM delayed by the delay circuit in FIG. 4 is supplied to the gate of the transistor $Q_{13}$ in the row decoder. Therefore, the leading edge of the row selection signal is delayed from that of the column selection signal. As shown in FIG. 7, the row and column selection signals simultaneously rise to the power supply voltage $V_{CC}$ after the level of the address signal ADD changes, and the program signal PGM then rises. The delayed program signal DPGM rises after a short period of time has elapsed from the rise of the program signal PGM. The column selection signal CLM rises from the $V_{CC}$ level to the $V_{PP}$ level, and thereafter, the row selection signal RWS rises from the $V_{CC}$ level to the $V_{PP}$ level. Therefore, the data can be properly programmed even if the programming voltage $V_{PP}$ is relatively low.

Figure 8:
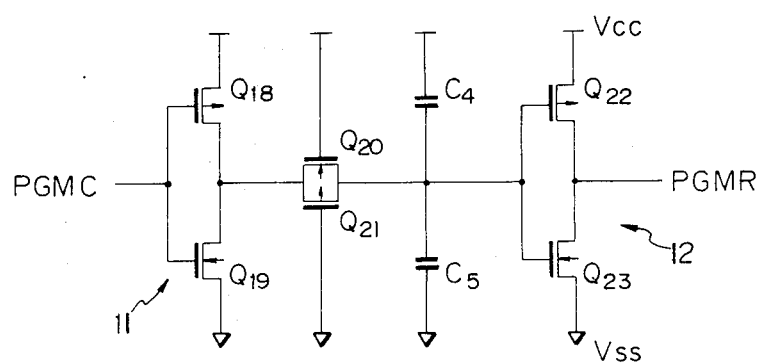
FIGS. 8, 9, 10, 11, and 12 are circuit diagrams showing various circuit portions of a memory device as another embodiment of the present invention.

A semiconductor memory device using a CMIS circuit will be described in accordance with another embodiment of the present invention. FIG. 8 shows a delay circuit using a CMIS circuit. This delay circuit corresponds to that shown in FIG. 4. In the circuit shown in FIG. 8, the program signal PGMC is inverted by a CMIS inverter 11 consisting of a P-channel MOS transistor $Q_{18}$ and an N-channel MIS transistor $Q_{19}$. The inverted program signal is supplied to a parallel circuit of an N-channel MIS transistor $Q_{20}$ and a P-channel MIS transistor $Q_{21}$. The parallel circuit of the transistors $Q_{20}$ and $Q_{21}$ serves as a resistor, and this parallel circuit and capacitors $C_4$ and $C_5$ constitute an integrator. The inverted program signal is delayed by the integrator and is inverted again by a CMIS inverter 12 consisting of a P-channel MIS transistor $Q_{22}$ and an N-channel MIS transistor $Q_{23}$, thereby obtaining a delayed program signal PGMR.

Figure 9:
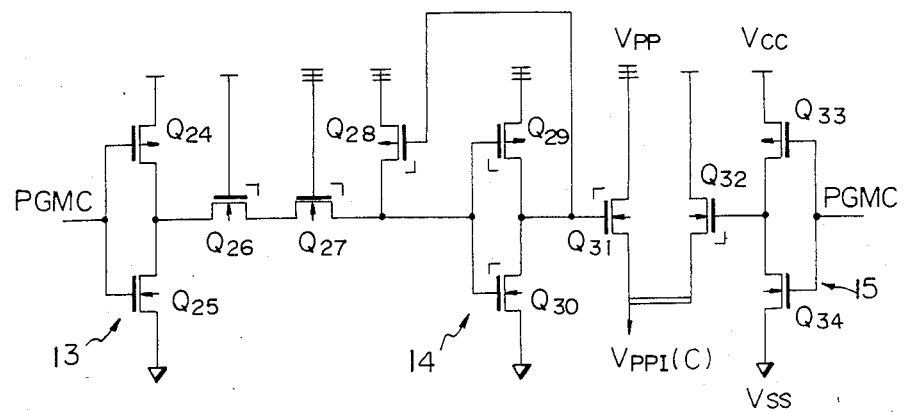

FIG. 9 shows a power switching circuit for generating an internal power supply voltage $V_{PPI}(C)$ to be supplied to the column decoder. The power switching circuit comprises a CMIS inverter 13 consisting of a P-channel MIS transistor $Q_{24}$ and an N-channel MIS transistor $Q_{25}$, high-breakdown voltage cut off N-channel MIS transistors $Q_{26}$ and $Q_{27}$, a high-breakdown voltage P-channel MIS transistor $Q_{28}$, a CMIS inverter 14 consisting of a high-breakdown voltage P-channel MIS transistor $Q_{29}$ and a high-breakdown voltage N-channel MIS transistor $Q_{30}$, a power supply switch consisting of a high-breakdown voltage N-channel nondosed MIS transistor $Q_{31}$ and a high-breakdown voltage N-channel depletion type MIS transistor $Q_{32}$, and a CMIS inverter 15 consisting of a P-channel MIS transistor $Q_{33}$ and an N-channel MIS transistor $Q_{34}$.

When the program signal PGMC is set at a high level, the circuit shown in FIG. 9 is set in the programming mode. In this case an output from the CMIS inverter 13 goes to a low level, and an output from the CMIS inverter 14 goes to a high level. The transistor $Q_{31}$ is thus turned on. Since an output from the CMIS inverter 15 is set at a low level, the transistor $Q_{32}$ is turned off. Therefore, the high voltage $V_{PP}$ is applied as the internal high voltage $V_{PPI}(C)$ to the column decoder through the transistor $Q_{31}$.

On the other hand, when the program signal PGMC is set at a low level, an output from the CMIS inverter 13 goes to a high level, and an output from the CMIS inverter 14 goes to a low level, so that the transistor $Q_{31}$ is cut off. Then an output from the CMIS inverter 15 goes to a high level, and the transistor $Q_{32}$ is turned on. The power supply voltage $V_{CC}$ is applied to the column decoder through the transistor $Q_{32}$, and thus the read operation is performed. In this case, since the output from the CMIS inverter 14 is set at a low level, the transistor $Q_{28}$ is turned on to completely cut off the transistor $Q_{29}$. Therefore, the input level of the transistor $Q_{31}$ is completely set at the power supply voltage $V_{PP}$.

Figure 10:
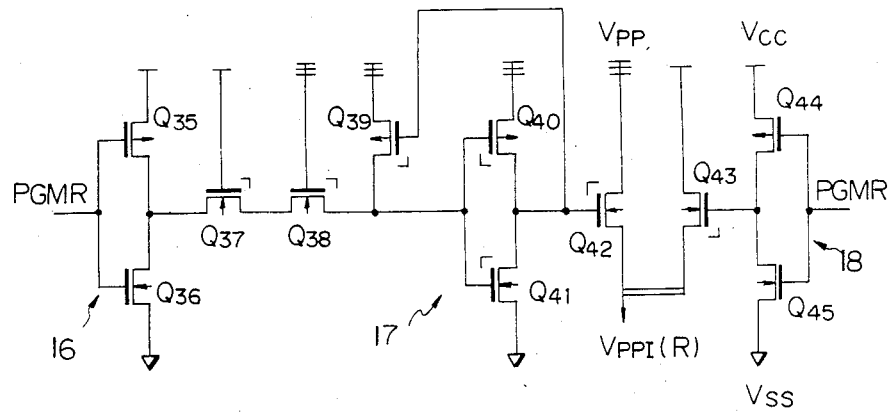

FIG. 10 shows a power supply switching circuit for generating an internal power supply voltage $V_{PPI}(R)$ to be supplied to the row decoder. The circuit in FIG. 10 has the same arrangement as shown in FIG. 9 and comprises a CMIS inverter 16 composed of the transistors $Q_{35}$ and $Q_{36}$, a separator for transistors $Q_{37}$ and $Q_{38}$, a CMIS inverter 17 composed of the transistors $Q_{39}$, $Q_{40}$, and $Q_{41}$, a power supply switch for transistors $Q_{42}$ and $Q_{43}$, and a CMIS inverter 18 composed of transistors $Q_{44}$ and $Q_{45}$. The operation of the circuit in FIG. 10 is substantially the same as that of FIG. 9, except that the delayed program signal PGMR from the circuit of FIG. 8 is supplied to the CMIS inverters 16 and 18. Therefore, the internal power supply voltage $V_{PPI}(R)$ from the circuit of FIG. 10 is sligtly delayed from the internal power supply voltage $V_{PPI}(C)$ from the circuit in FIG. 9.

Figure 11:
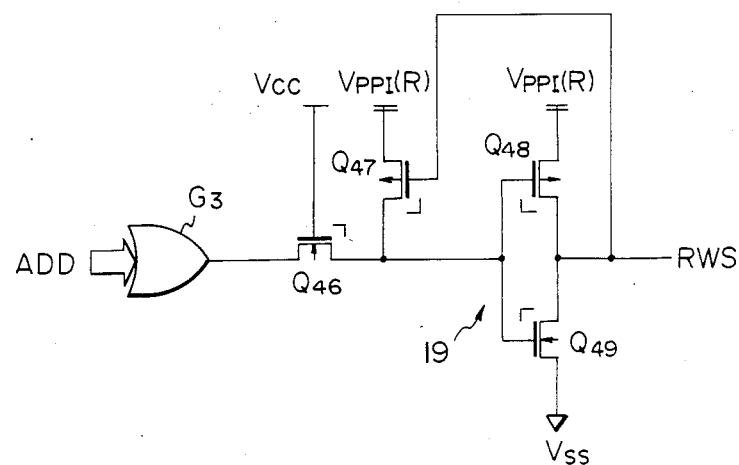

FIG. 11 shows a unit row decoder circuit provided to each row of the memory matrix. This unit row decoder circuit comprises an OR gate $G_3$, a high-withstand voltage N-channel MIS transistor $Q_{46}$, a high-breakdown voltage P-channel MIS transistor $Q_{47}$, and a CMIS inverter 19 consisting of a high-breakdown voltage P-channel MIS transistor $Q_{48}$ and a high-breakdown voltage N-channel MIS transistor $Q_{49}$.

When the associated row is selected, an output from the gate $G_3$ in the unit row decoder circuit in FIG. 11 goes to a low level, and an output (i.e., the row selection signal RWS) from the CMIS inverter 19 goes to a high level. In this case, when the memory device is set in the programming mode, the internal power supply voltage $V_{PPI}(R)$ from the power supply switching circuit in FIG. 10 is set at the high voltage $V_{PP}$, so that the row selection signal RWS becomes substantially the same as the high voltage $V_{PP}$. On the other hand, in the read mode, the internal power supply voltage $V_{PPI}(R)$ becomes substantially the same as the power supply voltage $V_{CC}$. Therefore, the row selection signal RWS becomes substantially the same as the power supply voltage $V_{CC}$. In this case, the transistor $Q_{47}$ is kept turned off.

When the row is not selected, an output from the gate $G_3$ goes to a high level, and the row selection signal RWS goes to a low level. In this case, the transistor $Q_{47}$ is turned on and the input terminal of the CMIS inverter 19 rises. Therefore, the row selection signal RWS is completely clamped to a low level.

Figure 12:
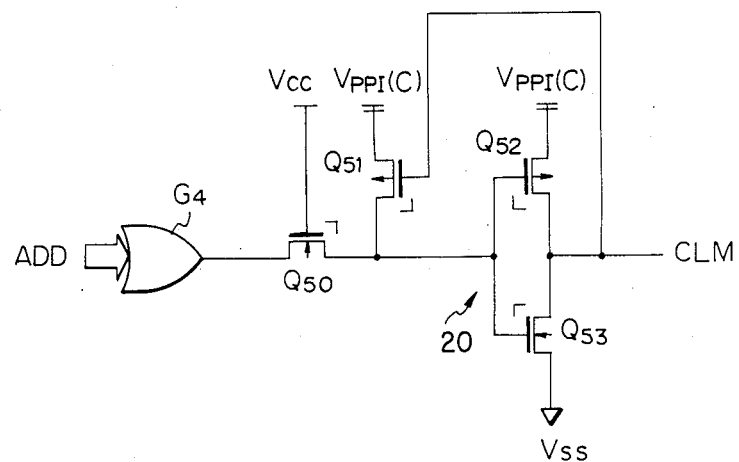

FIG. 12 shows the arrangement of a unit column decoder circuit. This unit column decoder circuit has the same arrangement as the row decoder circuit of FIG. 11, except that the power supply voltage $V_{PPI}(C)$ supplied from the power supply switching circuit in FIG. 9 is used as the internal power supply voltage. As is apparent from the circuits shown in FIGS. 11 and 12, the row selection signal RWS is slightly delayed from the column selection signal CLM. Thus, even if the programming voltage $V_{PP}$ is low, data can be properly programmed.

According to the present invention, since the high voltage applied to the control gate of the floating gate transistor is delayed from the high voltage applied to the drain, data can be properly programmed even if the programming voltage is low, the sizes of the peripheral transistors can be decreased, and hence a highly integrated memory can be obtained.

What is claimed is:

1. A programmable read-only memory device comprising:
    a plurality of memory cell transistors arrayed in columns and rows and each having a source, a drain, a floating gate and a control gate formed above said floating gate;
    a means for generating a column selection signal which applies a high programming voltage to the drain of a memory cell transistor of a selected column under control of a program signal, said means being connected to a source of a high programming voltage, the drain of said memory cell transistor and said program signal;
    a means for generating a row selection signal which applies a high programming voltage to the control gate of a memory cell transistor of a selected row under control of a delayed-program signal; and
    a delay means for receiving said program signal, and for generating a delayed-program signal supplied to said means for generating a row selection signal, for delaying the application timing of said high programming voltage from said means for generating a row selection signal to the control gate of the memory cell transistor of the selected row with respect to the application timing of the high programming voltage from said means for generating a column selection signal to the drain of the memory cell transistor of the selected column,
    whereby a programming operation is performed for a memory cell transistor of a selected column and row by applying the high programming voltage to the control gate of the memory cell transistor at an application timing delayed with respect to the application timing of the high programming voltage applied to the drain of the memory cell transistor.

2. A programmable read-only memory device according to claim 1, wherein said delay means comprises one or more inverters connected in cascade, and one or more capacitors each being connected respectively to an output of one of said inverters.

3. A programmable read-only memory device according to claim 1, wherein said means for generating a row selection signal comprises:
    a gate circuit for decoding input row addresses,
    a high breakdown voltage depletion type transistor having a source connected to an output terminal of said gate circuit and having a gate which receives a power supply voltage, and
    a high breakdown voltage zero threshold voltage type transistor having a gate which receives said delayed program signal and a high breakdown voltage low threshold voltage depletion type transistor whose gate and source are interconnected, said high breakdown voltage zero threshold voltage type transistor and said high breakdown voltage low threshold voltage depletion type transistor being connected in series and said series-connected transistors being inserted between a high voltage power supply and a drain of said high breakdown voltage depletion type transistor.

4. A programmable read-only memory device according to claim 1, wherein said means for generating a column selecting signal comprises:
    a gate circuit for decoding input column addresses,
    a high breakdown voltage depletion type transistor having a source connected to an output terminal of said gate circuit and having a gate which receives a power supply voltage, and
    a high breakdown voltage zero threshold voltage type transistor having a gate which receives said program signal and a high breakdown voltage low threshold voltage depletion type transistor whose gate and source are interconnected, said high breakdown voltage zero threshold voltage type transistor and said high breakdown voltage low threshold voltage depletion type transistor being connected in series and said series-connected transistors being inserted between a high voltage power supply and a drain of said high breakdown voltage depletion type transistor.

5. A programmable read-only memory device comprising:
    a plurality of memory cell transistors arrayed in columns and rows and each having a source, a drain, a floating gate, and a control gate formed above said floating gate;

a means for generating a column selection signal which applies a high programming voltage to the drain of a memory cell transistor of a selected column;

a first power switch circuit for generating internal power supply voltages supplied to said means for generating a column selection signal under the control of a program signal;

a means for generating a row selection signal which applies a high programming voltage to the control gate of a memory cell transistor of a selected row;

a second power switch circuit for generating internal power supply voltage supplied to said means for generating a row selection signal under the control of a delayed-program signal; and a delay means for generating said delayed-program signal for delaying the application timing of a high programming voltage to the control gate of a selected one of said memory cell transistors from the application timing of a high programming voltage to the drain of said selected memory cell transistor when a data programming operation is performed by applying said high programming voltages to the control gate and drain of said selected memory cell transistor.

6. A programmable read-only memory device according to claim 5, wherein said first power switch circuit comprises first and second high breakdown voltage transistors which are alternately turned on by said program signal, said first high breakdown voltage transistor supplying a high internal power supply voltage to said means for generating a column selection signal when said first high breakdown voltage transistor is turned on, and said second high breakdown voltage transistor supplying a low internal power supply voltage to said means for generating a column selection signal when said second high breakdown voltage transistor is turned on.

7. A programmable read-only memory device according to claim 5, wherein said second power switch circuit comprises first and second high breakdown voltage transistors which are alternately turned on by said delayed program signal, said first high breakdown voltage transistor supplying a high internal power supply voltage to said means for generating a row selection signal when said first high breakdown voltage transistor is turned on, and said second high breakdown voltage transistor supplying a low internal power supply voltage to said means for generating a row selection signal when said second high breakdown voltage transistor is turned on.

8. A programmable read-only memory device according to claim 5, wherein said means for generating a row selection signal comprises:

a gate circuit for decoding input row addresses, a first high breakdown voltage type transistor having a source connected to an output terminal of said gate circuit and having a gate which receives a power supply voltage, a CMIS inverter composed of high breakdown voltage MIS transistors, said inverter having an input terminal connected to the drain of said first high breakdown voltage type transistor and being supplied with said internal power supply voltages supplied from said second power switch circuit, and a second high breakdown voltage type transistor connected between said second power switch circuit and a drain of said first high breakdown voltage type transistor and having a gate which receives an output signal of said CMIS inverter.

9. A programmable read-only memory device according to claim 5, wherein said means for generating a column selection signal comprises:

a gate circuit for decoding input column addresses, a first high breakdown voltage type transistor having a source connected to an output terminal of said gate circuit and a gate which receives a power supply voltage, a CMIS inverter composed of high breakdown voltage MIS transistors, said inverter having an input terminal to a drain of said first high breakdown voltage type transistor and being supplied with said internal power supply voltages supplied from said first power switch circuit, and a second high breakdown voltage type transistor connected between said first power switch circuit and a drain of said first high breakdown voltage type transistor and having a gate which receives an output signal of said CMIS inverter.

10. A programmable read-only memory device according to claim 5, wherein said delay means delays said program signal to generate said delayed program signal.

11. A programmable read-only memory device according to claim 10, wherein said delay means comprises an integrator circuit having an N-channel MIS transistor and a P-channel MIS transistor connected in parallel and inserted between an input terminal and an output terminal of said integrator circuit, and a capacitor connected between said output terminal and a power source.

* * * * *